United States Patent
Liang et al.

(10) Patent No.: US 10,050,147 B2
(45) Date of Patent: Aug. 14, 2018

(54) SEMICONDUCTOR DEVICE AND MANUFACTURING METHOD THEREOF

(71) Applicant: TAIWAN SEMICONDUCTOR MANUFACTURING COMPANY, Hsinchu (TW)

(72) Inventors: Chun-Sheng Liang, Changhua County (TW); Shih-Hsun Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/809,158

(22) Filed: Jul. 24, 2015

(65) Prior Publication Data

US 2017/0025536 A1 Jan. 26, 2017

(51) Int. Cl.
*H01L 29/78* (2006.01)
*H01L 21/283* (2006.01)
*H01L 29/66* (2006.01)

(52) U.S. Cl.
CPC ........ *H01L 29/7848* (2013.01); *H01L 21/283* (2013.01); *H01L 29/66545* (2013.01); *H01L 29/66795* (2013.01); *H01L 29/785* (2013.01)

(58) Field of Classification Search
CPC ............... H01L 29/7848; H01L 29/785; H01L 29/7851; H01L 29/41791; H01L 29/66795; H01L 29/66545; H01L 29/6656; H01L 29/66553; H01L 29/6681; H01L 21/823462; H01L 21/823468
See application file for complete search history.

(56) References Cited

U.S. PATENT DOCUMENTS 5,882,993 A * 3/1999 Gardner .......... H01L 21/823857
257/E21.639
6,033,943 A * 3/2000 Gardner .......... H01L 21/823857
257/E21.639
7,118,954 B1 * 10/2006 Lin ................. H01L 21/823462
257/E21.438

(Continued)

FOREIGN PATENT DOCUMENTS

KR 2000-0073979 A 12/2000
KR 10-2014-0107073 A 9/2014

*Primary Examiner* — Joshua King
(74) *Attorney, Agent, or Firm* — McDermott Will & Emery LLP

(57) ABSTRACT

A method of semiconductor fabrication includes forming a dielectric layer over a substrate. A dummy gate structure is formed on the dielectric layer, which defines a dummy gate dielectric region. A portion of the dielectric layer not included in the dummy gate dielectric region is etched to form a dielectric etch back region. A spacer element is formed on a portion of the dielectric etch back region, which abuts the dummy gate structure, and defines a spacer dielectric region A height of the dummy gate dielectric region is greater than the height of the spacer dielectric region. A recessed portion is formed in the substrate, over which a strained material is selectively grown to form a strained recessed region adjacent the spacer dielectric region. The dummy gate structure and the dummy gate dielectric region are removed. A gate electrode layer and a gate dielectric layer are formed.

18 Claims, 18 Drawing Sheets

(56) References Cited

U.S. PATENT DOCUMENTS

| | | | |
|---|---|---|---|
| 8,067,283 B2* | 11/2011 | Lin | H01L 21/823462 257/E21.634 |
| 8,114,728 B2* | 2/2012 | Pas | H01L 21/28079 257/E21.637 |
| 8,487,378 B2 | 7/2013 | Goto et al. | |
| 8,530,974 B2* | 9/2013 | Cheng | H01L 21/823857 257/369 |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,330,980 B2* | 5/2016 | Liang | H01L 21/823468 |
| 9,362,405 B1* | 6/2016 | Jacob | H01L 29/7851 |
| 2004/0150066 A1* | 8/2004 | Inoue | H01L 21/823418 257/500 |
| 2004/0227185 A1* | 11/2004 | Matsumoto | H01L 21/28052 257/347 |
| 2006/0121740 A1* | 6/2006 | Sakai | H01L 21/823857 438/758 |
| 2007/0200185 A1* | 8/2007 | Hirase | H01L 29/4983 257/410 |
| 2008/0076214 A1* | 3/2008 | Han | H01L 21/28123 438/197 |
| 2009/0104746 A1* | 4/2009 | Clifton | H01L 29/0673 438/299 |
| 2011/0151655 A1* | 6/2011 | Chan | H01L 21/28079 438/589 |
| 2012/0003806 A1* | 1/2012 | Wang | H01L 29/66545 438/305 |
| 2012/0132966 A1* | 5/2012 | Doris | B81C 1/00095 257/288 |
| 2012/0187501 A1* | 7/2012 | Zhu | H01L 21/76229 257/369 |
| 2013/0084682 A1* | 4/2013 | Lee | H01L 21/823412 438/198 |
| 2014/0197410 A1* | 7/2014 | Yin | H01L 21/76283 257/57 |
| 2014/0239354 A1* | 8/2014 | Huang | H01L 29/66545 257/288 |
| 2014/0239404 A1* | 8/2014 | Huang | H01L 27/0924 257/369 |
| 2014/0282326 A1 | 9/2014 | Chen et al. | |
| 2014/0335673 A1* | 11/2014 | Kim | H01L 29/66545 438/283 |
| 2014/0353719 A1* | 12/2014 | Kim | H01L 27/0886 257/192 |
| 2015/0001468 A1* | 1/2015 | Huang | H01L 29/66977 257/24 |
| 2015/0076609 A1* | 3/2015 | Xie | H01L 29/785 257/365 |
| 2015/0194348 A1* | 7/2015 | Liang | H01L 21/823412 438/275 |
| 2015/0270398 A1* | 9/2015 | Jacob | H01L 29/7849 257/401 |
| 2016/0163601 A1* | 6/2016 | Xie | H01L 21/28088 257/392 |
| 2016/0218180 A1* | 7/2016 | You | H01L 29/6681 |
| 2017/0133489 A1* | 5/2017 | Zhou | H01L 29/66795 |

\* cited by examiner

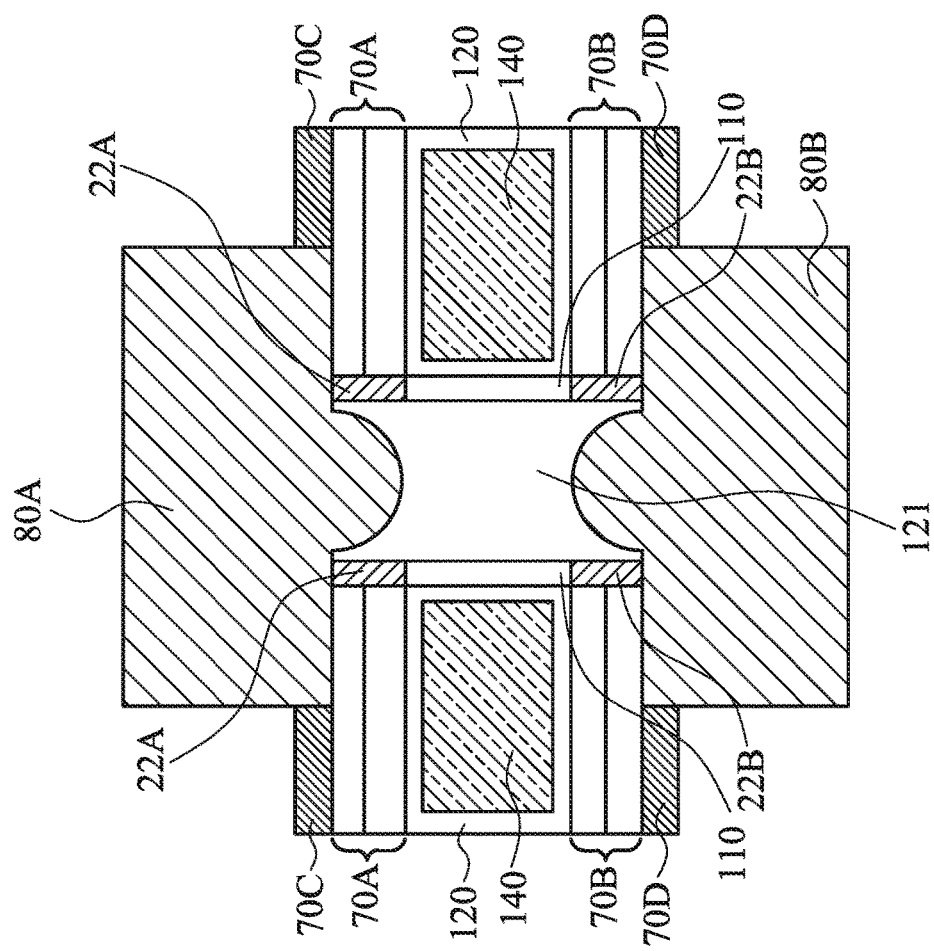

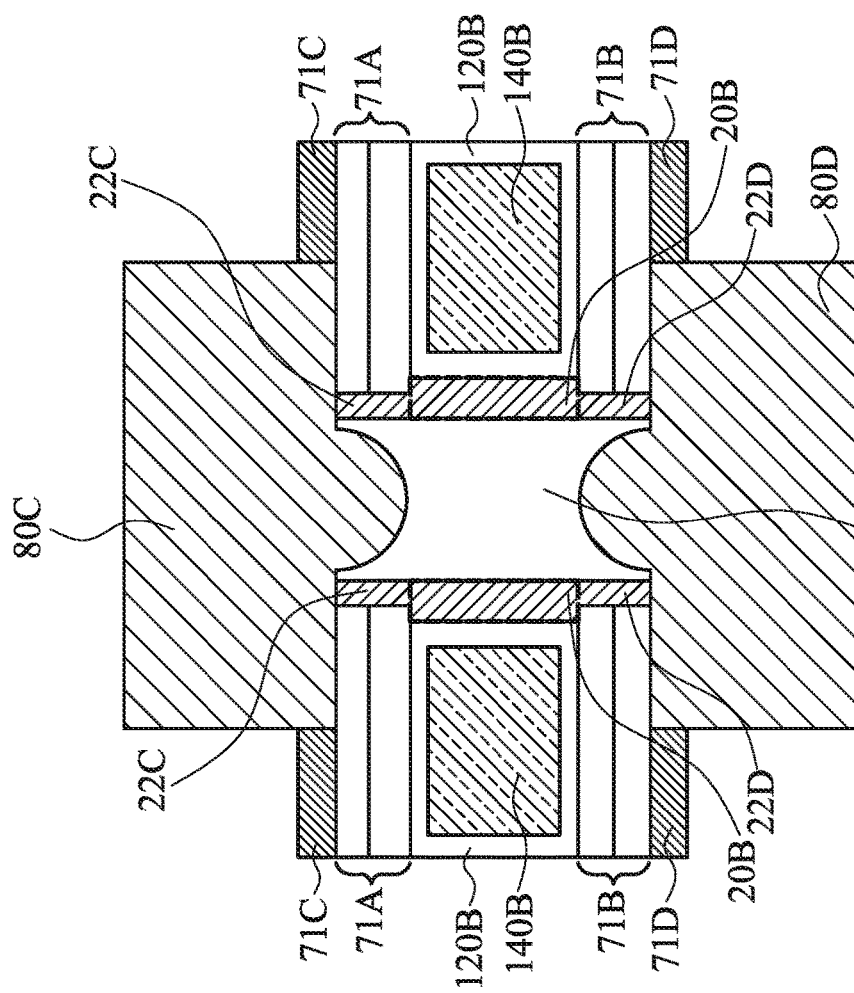

US 10,050,147 B2

SEMICONDUCTOR DEVICE AND MANUFACTURING METHOD THEREOF

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain (S/D) regions of semiconductor transistor devices are formed. A gate is formed over and along the sides of the fin structure (e.g., wrapping) utilizing the advantage of the increased surface area of the channel and S/D regions to produce faster, more reliable and better-controlled semiconductor transistor devices. In some devices, strained materials in S/D portions of the Fin FET utilizing, for example, silicon germanium (SiGe), silicon carbide (SiC), and/or silicon phosphide (SiP) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-8B show exemplary sequential processes for manufacturing the Fin FET device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

As noted above, a gate is formed over and along the sides of the fin structure (e.g., wrapping) utilizing the advantage of the increased surface area of the channel and S/D regions to produce faster, more reliable and better-controlled semiconductor transistor devices. One process of implementing the gate is termed a "gate last" or "replacement gate" methodology. In such a process, a dummy (e.g., polysilicon) gate is initially formed, various processes associated with the semiconductor device are performed, and the dummy gate is subsequently removed and replaced with a gate (e.g., metal gate). During the process of removing the dummy gate, a region in spacer dielectric regions below spacer elements adjacent the dummy gate may be narrowed. Strained materials in S/D portions may be removed due to the narrower region of spacer dielectric regions, thus creating gate to S/D encroachment and poor isolation.

FIGS. 1A-8B show exemplary processes for manufacturing a semiconductor FET device having a fin structure (Fin FET). It is understood that additional operations can be provided before, during, and after operations shown by FIGS. 1A-8B, and some of the operations described below can be replaced or eliminated, for additional embodiments of the method. The order of the operations may be interchangeable.

Figure 1A:
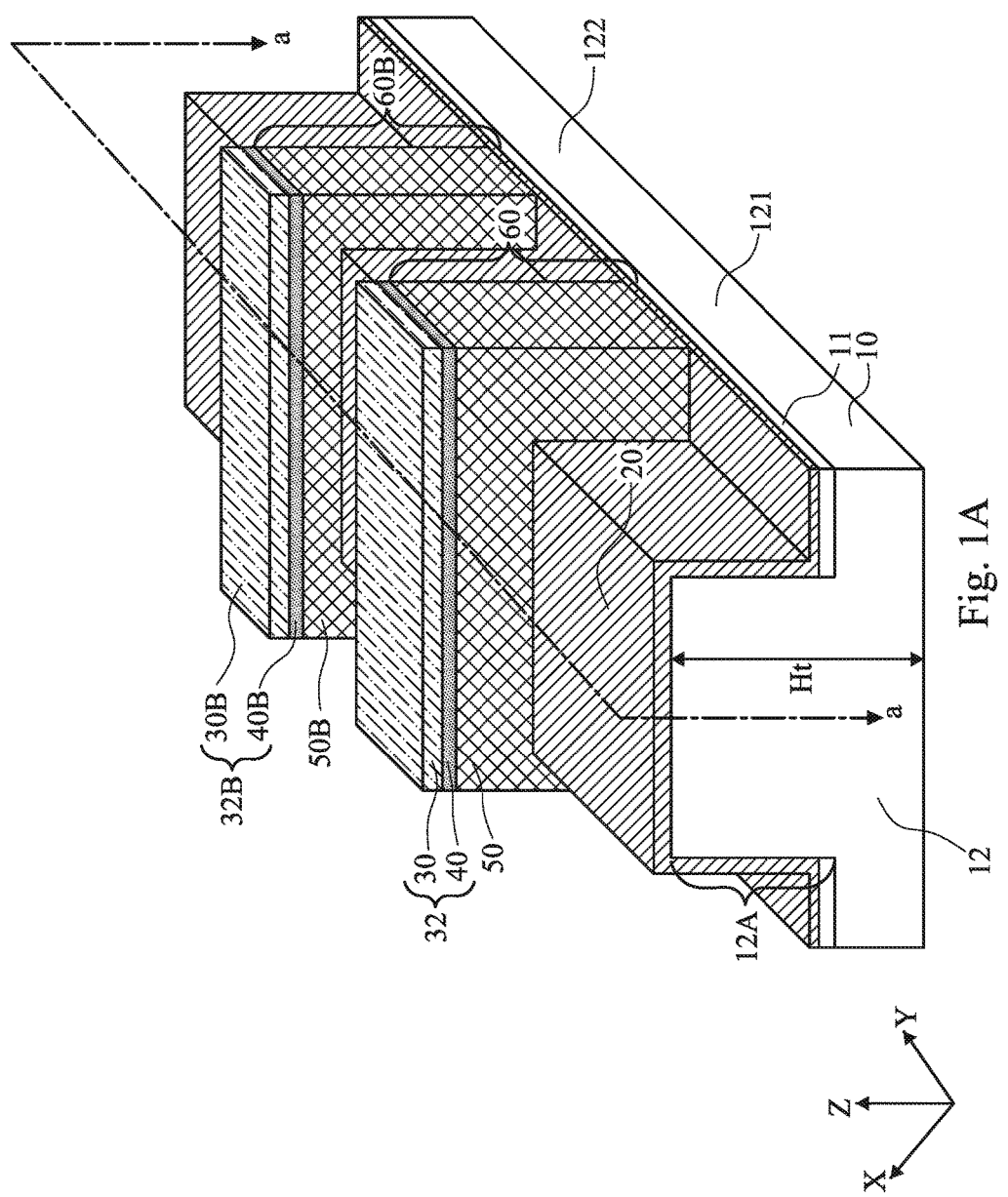
Figure 1B:
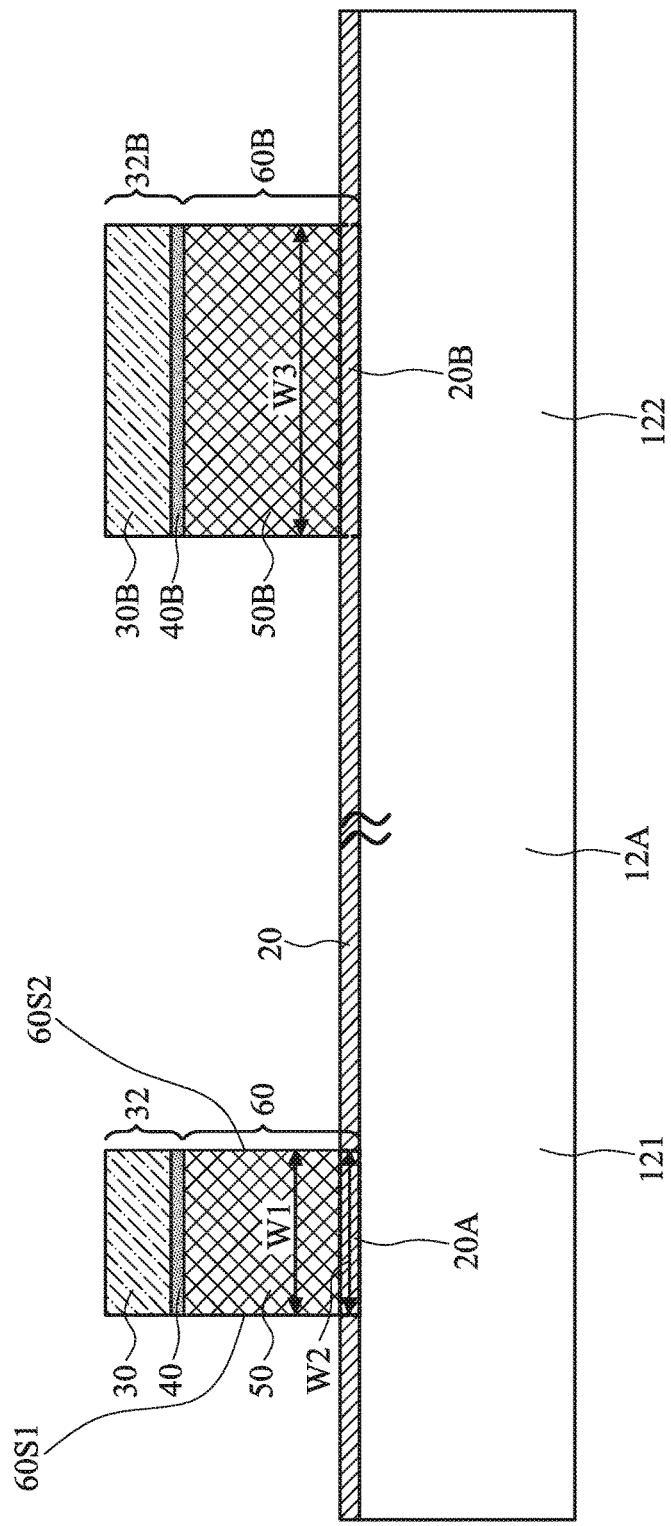

As shown in FIG. 1A, fin structures are fabricated over a core region and over a peripheral region on a substrate. In some embodiments, the core region refers to a part of a core circuit in an electronic system that primarily performs logical operations, and the peripheral region refers to a part of a peripheral circuit (e.g., I/O circuit) in the electronic system that performs, for example, data input and data output operations. FIG. 1A is an exemplary perspective view of the Fin FET device at one of the various stages of the fabrication process according to one embodiment. FIG. 1B is an exemplary cross sectional view along the line a-a of FIG. 1A.

A fin structure 12 includes a first fin structure 121 corresponding to a core region and a second fin structure 122 corresponding to a peripheral region. Although the first fin structure 121 and the second fin structure 122 are disposed adjacent each other (as part of the same fin structure 12) in FIG. 1A for an illustrative purpose, they are not necessarily disposed adjacent each other, and the first fin structure 121 and the second fin structure 122 may be disposed in different regions and separately formed in a semiconductor device. The fin structure 12 is formed over a substrate 10 and protrudes from an isolation insulating layer 11. To fabricate a fin structure, a mask layer is formed over the substrate 10 by, for example, a thermal oxidation process and/or a chemical vapor deposition (CVD) process. The substrate 10 is, for example, a p-type silicon substrate. In other embodiments, the substrate 10 is an n-type silicon substrate. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

In this embodiment, a bulk silicon wafer is used as a starting material and constitutes the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 12.

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the substrate 10 is patterned into fin structure 12 by trench etching using a dry etching method and/or a wet etching method. A height (Ht) of the fin structure 12 is in a range of about 20 nm to about 300 nm. In certain embodiments, the height is in a range of about 30 nm to about 150 nm. When the heights of the fin structures are not uniform, the height from the substrate may be measured from the plane that corresponds to the average heights of the fin structures. The width of the fin structure 12 is in a range of about 5 nm to 15 nm.

As shown in FIG. 1A, one fin structure 12 extends in the Y direction. However, the number of the fin structures is not limited to one. The number may be two, three, four or five or more. In addition, one or more dummy fin structures may be disposed adjacent both sides of the fin structure 12 to improve pattern fidelity in patterning processes. The width of the fin structure 12 is in a range of about 4 nm to about 40 nm in some embodiments, and may be in a range of about 5 nm to about 15 nm in certain embodiments. The height (Ht) of the fin structure 12 is in a range of about 20 nm to about 300 nm in some embodiments, and may be in a range of about 30 nm to 150 nm in other embodiments. One skilled in the art will realize, however, that the dimensions and values recited throughout the descriptions are merely examples, and may be changed to suit different scales of integrated circuits.

After forming the fin structure, an isolation insulating layer 11 is formed over the fin structure 12. The isolation insulating layer 11 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) are removed, the flowable film densifies and shrinks. In some embodiments, multiple anneal processes are conducted.

The flowable film is cured and annealed more than once. The flowable film may be doped with boron and/or phosphorous. The isolation insulating layer 11 may be formed by one or more layers of SOG, SiO, SiON, SiOCN and/or fluoride-doped silicate glass (FSG) in some embodiments.

After forming the isolation insulating layer 11 over the fin structure 12, a planarization operation is performed so as to remove part of the isolation insulating layer 11 and the mask layer (the pad oxide layer and the silicon nitride mask layer). The planarization operation may include a chemical mechanical polishing (CMP) and/or an etch-back process. Then, the isolation insulating layer 11 is further removed so that an upper part of the fin structure 12, which is to become a channel layer 12A, is exposed, as shown in FIG. 1A.

In certain embodiments, the partially removing of the isolation insulating layer 11 may be performed using a wet etching process, for example, by dipping the substrate in hydrofluoric acid (HF). In other embodiments, the partially removing the isolation insulating layer 11 may be performed using a dry etching process. For example, a dry etching process using $CHF_3$ or $BF_3$ as etching gases may be used.

After forming the isolation insulating layer 11, a thermal process, for example, an anneal process, may be performed to improve the quality of the isolation insulating layer 11. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

First dummy gate structure 60 and second dummy gate structure 60B are formed as shown in FIGS. 1A and 1B.

A dielectric layer 20 and a poly silicon layer are formed over the isolation insulating layer 11 and the exposed fin structure 12, and then patterning operations are performed so as to obtain a first dummy gate structure 60 and a second dummy gate structure 60B. The first dummy gate structure 60 includes a first dummy gate electrode layer 50 made of poly silicon and a dummy gate dielectric region 20A. The second dummy gate 60B includes a second dummy gate electrode layer 50B made of poly silicon and a dummy gate dielectric region 20B.

The patterning of the poly silicon layer in the first dummy gate structure 60 is performed by using a hard mask 32 including two layers 30, 40 in some embodiments. In some embodiments, the first layer 30 may be a silicon oxide layer and the second layer 40 may be a silicon nitride layer. In other embodiments, the first layer 30 may be a silicon nitride layer and the second layer 40 may be a silicon oxide layer. The patterning of the poly silicon layer in the second dummy gate structure 60B is also performed by using a hard mask 32B including a silicon nitride layer 40B and a silicon oxide layer 30B in some embodiments. In other embodiments, the order of the silicon nitride and silicon oxide layers may be reversed.

The dummy gate dielectric layer 20 may be silicon oxide formed by thermal oxidation, CVD, PVD, ALD, e-beam evaporation, or other suitable process. In some embodiments, the dielectric layer 20 may include one or more layers of high-k dielectrics, such as hafnium oxide ($HfO_2$). High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer 20 is in a range of about 3 nm to about 4 nm. That is, the height (H) of the dummy gate dielectric region 20A is in a range of about 3 nm to about 4 nm. The dummy gate dielectric region 20A is defined by a first sidewall and a second sidewall of the first dummy gate structure 60, and the first sidewall and second sidewall extend substantially perpendicular to a top surface of the dielectric layer 20. That is, the width (W2) of the dummy gate dielectric region 20A is the same as the width (W1) of the dummy gate electrode layer 50.

In some embodiments, the first and second dummy gate electrode layers 50, 50B may comprise a single layer or multilayer structure. The first and second dummy gate electrode layers 50, 50B may include polysilicon and/or other suitable layers. The first and second dummy gate electrode layers 50, 50B may be formed by depositing a layer of polysilicon. The layer of polysilicon may then be patterned and etched into a polysilicon gate electrode. The first and second dummy gate electrode layers 50, 50B may be formed using a suitable process such as ALD, CVD, PVD, plating, patterning or combinations thereof. In the present embodiment, the width of the first and second dummy gate electrode layer 50, 50B is in the range of about 20 nm to about 300 nm. In some embodiments, a thickness of the first and second dummy gate electrode layer 50, 50B is in a range of about 25 nm to about 240 nm. The width (W3) of the second dummy gate electrode layer 50B is greater than that of the first dummy gate electrode layer 50 in some embodiments.

Figure 2:
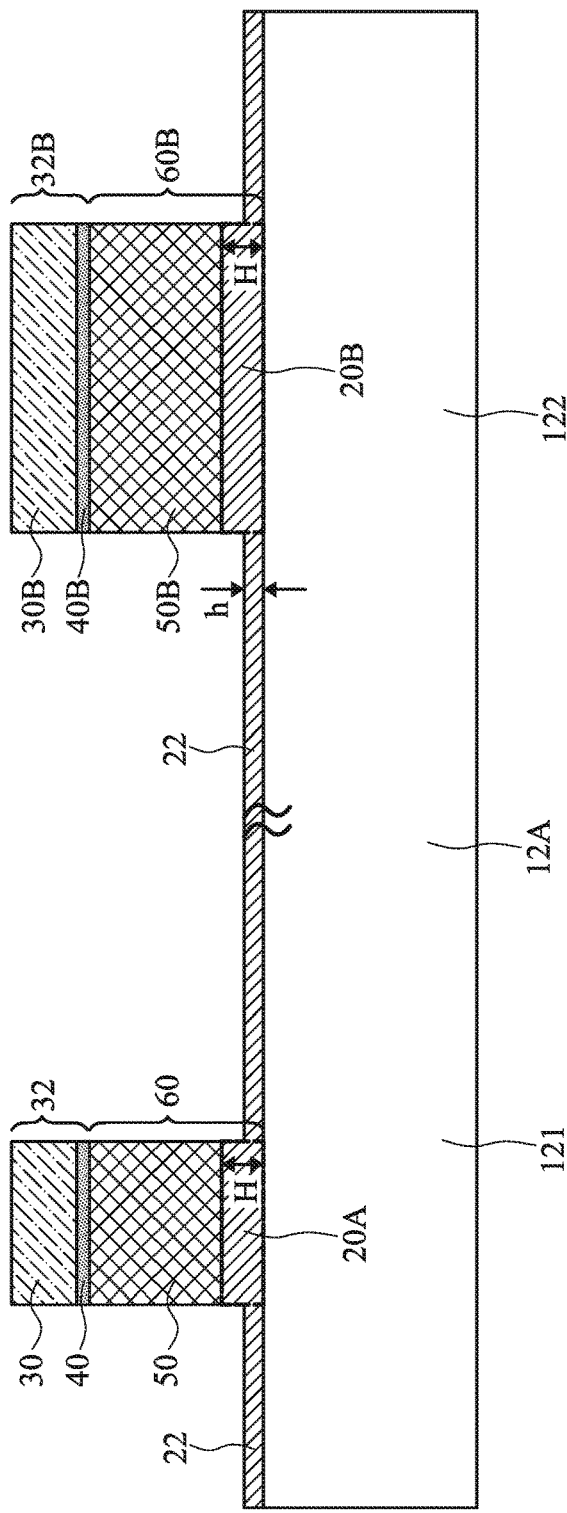

As shown in FIG. 2, a portion of the dielectric layer 20 is partially etched using an etching process (wet etch, dry etch, plasma etch, etc.) that is selective to the hard mask 32 to form a dielectric etch back region 22. The dielectric etch back region 22 is a region other than the dummy gate dielectric region 20A and the gate dielectric region 20B and is adjacent the dummy gate dielectric region 20A and the gate dielectric region 20B. The etching process may include removal of the dielectric layer 20 by one or more etching cycles. Each etching cycle may include removal of 0.5 nm to 1 nm of the dielectric layer. The total thickness of the dielectric layer 20 that is removed is in a range of about 1 nm to about 3 nm. That is, the difference between the height (H) of the dummy gate dielectric region 20A or the gate dielectric region 20B and the height (h) of the dielectric etch back region 22 is in a range of about 1 nm to about 3 nm. In some embodiments, a surface treatment process may be performed in the dielectric etch back region 22, such as oxidation, nitridation or ion implantation (e.g., carbon ions).

Figure 3:
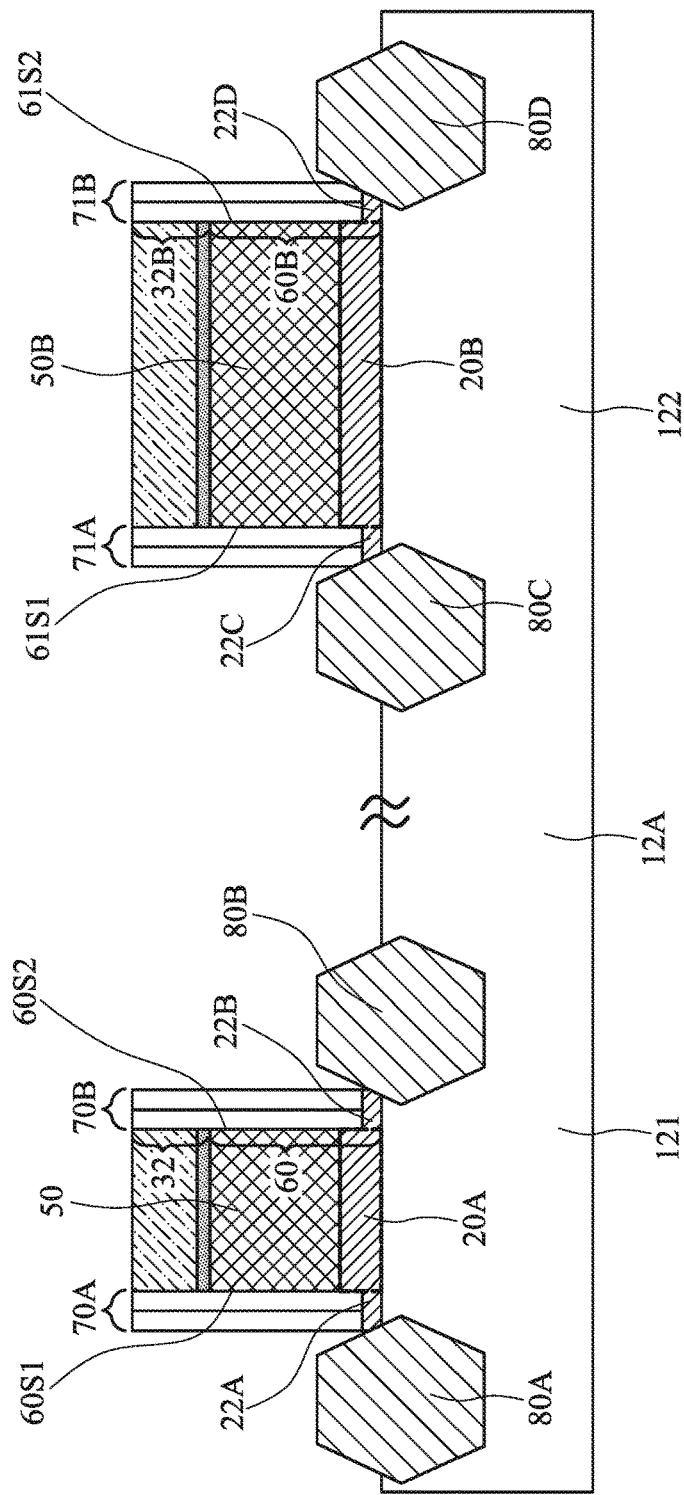

As shown in FIG. 3, spacer elements 70A, 70B, 71A and 71B are formed over the dummy gate structures 60 and 60B, respectively, and on a portion of the dielectric etch back region 22. The spacer elements 70A and 70B include two layers of spacer element layers in this embodiment. The thickness of a spacer element layer may be between approximately 2 nm and approximately 5 nm. In other embodiments, the spacer element layer may be greater than approximately 5 nm in thickness. The number of spacer element layers is not limited to two. The number may be one, three, four or five or more. The spacer elements 70A and 70B are disposed adjacent both major vertical sides of the dummy gate structure 60, such as the first sidewall 60S1 and second sidewall 60S2, respectively. Spacer elements 70A and 70B are disposed facing source region 80A and drain region 80B, respectively. The spacer element layer may include one or more layers of silicon nitride, silicon oxide, silicon oxynitride, SiCN, SiOCN, and/or other suitable dielectric materials. The materials of the two layers of the spacer element layers may be different in some embodiments, and may be the same in other embodiments.

In some embodiments, the spacer elements 71A and 71B are formed in accordance with the details described with reference to the spacer elements 70A and 70B, respectively. In some embodiments, the spacer elements 71A and 71B are simultaneously formed by the same operations as the spacer elements 70A and 70B. Spacer elements 71A and 71B are disposed adjacent both major vertical sides of the second dummy gate structure 60B, such as a third sidewall 61S1 and a fourth sidewall 61S2, respectively. Spacer elements 71A and 71B are disposed facing source region 80C and drain region 80D, respectively.

A spacer dielectric region 22A is defined by a first sidewall and a second sidewall of the spacer element 70A, and the first sidewall and second sidewall extend substantially perpendicular to a top surface of the spacer dielectric region 22A. A spacer dielectric region 22B, is defined by a first sidewall and a second sidewall of the spacer element 70B, and the first sidewall and second sidewall extend substantially perpendicular to a top surface of the spacer dielectric region 22B. That is, the width of the spacer dielectric region 22A or 22B is equal to or less than the width of the spacer element 70A or 70B, respectively.

Similarly, a spacer dielectric region 22C is defined by a first sidewall and a second sidewall of the spacer element 71A, and the first sidewall and second sidewall extend substantially perpendicular to a top surface of the spacer dielectric region 22C. A spacer dielectric region 22D is defined by a first sidewall and a second sidewall of the spacer element 71B, and the first sidewall and second sidewall extend substantially perpendicular to a top surface of the spacer dielectric region 22D. That is, the width of the spacer dielectric region 22C or 22D is equal to or less than the width of the spacer element 71A or 71B, respectively.

The first fin structure 121 and the second fin structure 122 in FIG. 3 are subsequently etched down to form one or more recessed portions (not shown). In some embodiments, using the pair of spacer elements 70A and 70B (and the first dummy gate structure 60) as hard masks, a biased etching process is performed to recess a top surface of the channel layer 12A that is unprotected or exposed to form the recessed portions of the first fin structure 121. Similarly, using the pair of spacer elements 71A and 71B (and the second dummy gate structure 60B) as hard masks, a biased etching process is performed to recess a top surface of the channel layer 12A that is unprotected or exposed to form the recessed portions of the first fin structure 122.

As shown in FIG. 3, a strained material may be selectively grown over the recessed portions and extend over the top surface of the channel layer 12A. In at least one embodiment, the strained material, such as silicon carbide (SiC) and SiP, is epi-grown by a LPCVD process to form the source region 80A or 80C and drain region 80B or 80D when the Fin FET is an n-type Fin FET. In at least another embodiment, the strained material, such as silicon germanium (SiGe), is epi-grown by a LPCVD process to form the source region 80A or 80C and drain region 80B or 80D when the Fin FET is a p-type Fin FET. The general operations for manufacturing a recessed S/D structure with strain materials (or stressor) in the fin structure are disclosed in U.S. Pat. No. 8,440,517, the entire contents of which are incorporated herein by reference.

Figure 4:
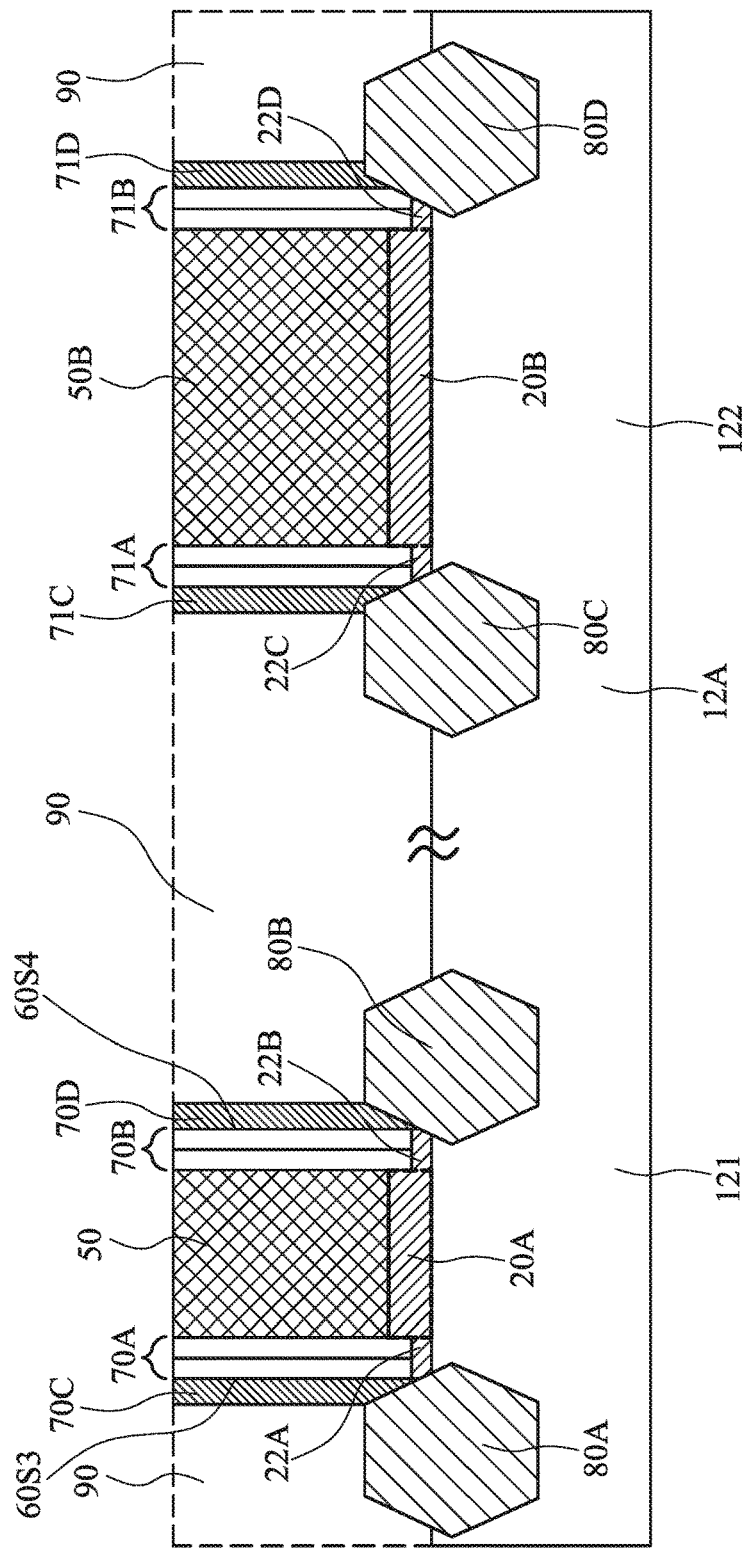

As shown in FIG. 4, additional spacer element layers 70C and 70D may be formed adjacent the spacer elements 70A and 70B, such as adjacent sidewalls 60S3 and 60S4, respectively. The additional spacer element layers 70C and 70D are formed after the source regions 80A and 80B are formed. The additional spacer element layers 70C and 70D may be formed using the same material and the same operations for forming the spacer element layers in spacer elements 70A and 70B, as discussed with reference to FIG. 3. The thickness of additional spacer element layer may be between approximately 2 nm and approximately 5 nm. In other embodiments, the thickness of the additional spacer element layers 70C and 70D may be greater than 5 nm. The number of additional spacer element layers is not limited to two. The number may be one, three, four or five or more. In addition, the additional spacer element layers 70C and 70D are disposed adjacent both main sides of the dummy gate electrode 50. The additional spacer element layer may include one or more layers of silicon nitride, silicon oxide, silicon oxynitride, SiCN, SiOCN, and/or other suitable dielectric materials. In some embodiments, the additional spacer element layer 70C may be formed before the source region 80A is formed. The additional spacer element layer 70D is formed after the drain region 80B is formed.

In some embodiments, additional spacer element layers 71C and 71D are formed in accordance with the details described with reference to the additional spacer element layers 70C and 70D, respectively. In some embodiments, the additional spacer element layers 71C and 71D are formed by the same operations as the additional spacer element layers 70C and 70D.

In some embodiments, an inter-layer dielectric (ILD) layer 90 may be formed over a portion of the channel layer 12A, the source regions 80A, 80C and the drain regions 80B, 80D. The ILD layer 90 may be formed by chemical vapor deposition (CVD), high density plasma CVD (HDP-CVD), spin-on deposition, physical vapor deposition (PVD or sputtering), or other suitable methods. The ILD layer 90 may include silicon oxide, silicon oxynitride, a low-k material, and/or other suitable dielectric. The ILD layer 90 may be formed on and surrounding the first dummy gate structure 60 and the second dummy gate structure 60B. The ILD layer 90 may be conformally deposited and a chemical mechanical polish (CMP) process performed to planarize the material. The first dummy gate structure 60 and the second dummy gate structure 60B may serve as a planarization stopper for the CMP process. In other words, the CMP process may be stopped at the exposure of the top surface of the first dummy gate structure 60 and the second dummy gate structure 60B. In some embodiments, the hard mask 32 and part of the spacer elements 70A,70B and/or additional spacer element layers 70C, 70D are removed from the first dummy gate structure 60 by the CMP process. In some embodiments, the hard mask 32B and part of the spacer elements 71A, 71B and/or additional spacer element layers 71C, 71D are removed from the second dummy gate structure 60B by the CMP process.

Figure 5:
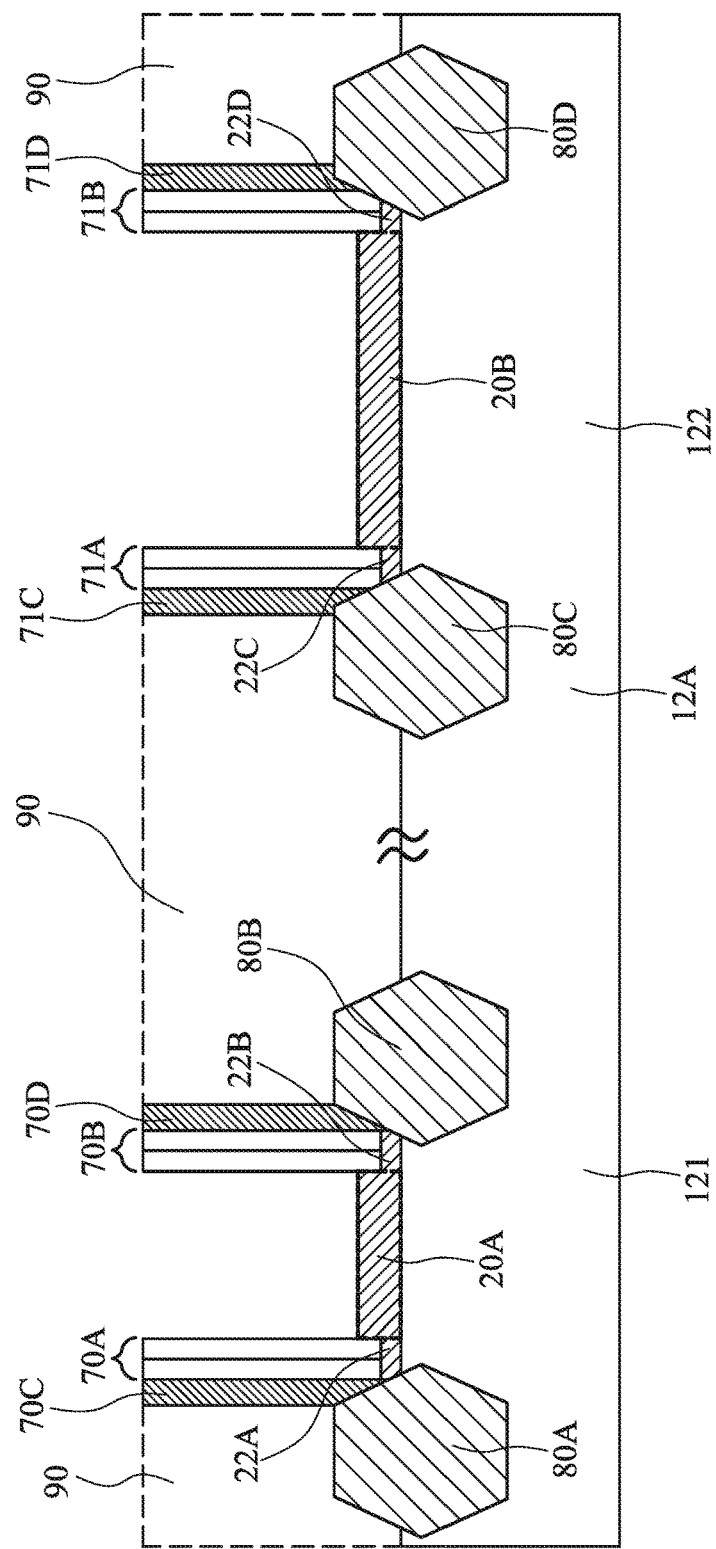
Figure 6:
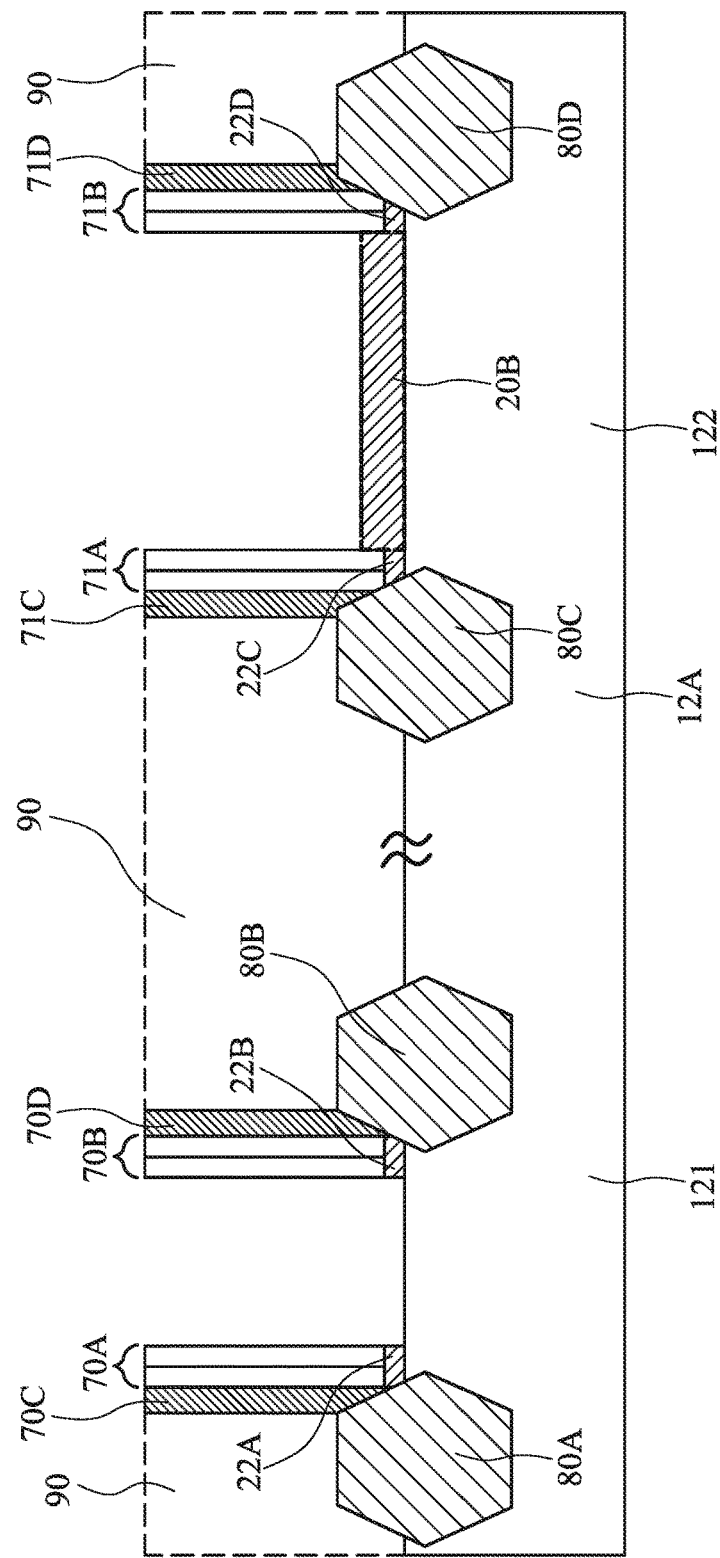

As shown in FIGS. 5-6, the first dummy gate structure 60 is removed. The first dummy gate structure 60 removal may include removing the dummy gate electrode 50 as shown in FIG. 5 and the dummy gate dielectric region 20A as shown in FIG. 6. The removal of the first dummy gate structure 60 provides an opening between the spacer element 70A and the spacer element 70B within which a metal gate will be formed, as is typically performed in a replacement gate process. The dummy gate electrode 50 may be removed by an etching solution such as, for example, aqueous ammonia, and/or other suitable etchant. In an alternative embodiment, the dummy gate electrode 50 may be removed by a suitable dry etching process. Exemplary etchants include chlorine based etchants.

In some embodiments, the dummy gate dielectric region 20A may be removed using an etching process (wet etch, dry etch, plasma etch, etc.). The removal of the dummy gate dielectric region 20A may expose a top surface of the channel layer 12A. It is noted that the spacer dielectric region 22A and 22B remain on the channel layer 12A underlying the spacer element 70A and the spacer element 70B respectively.

As shown in FIGS. 5-6, a part of the second dummy gate structure 60B is removed. The second dummy gate structure 60B removal may include removing the dummy gate electrode 50B as shown in FIG. 5. The dummy gate electrode 50B may be removed by an etching solution such as, for example, aqueous ammonia, and/or other suitable etchant. In an alternative embodiment, the dummy gate electrode 50B may be removed by a suitable dry etching process. Example etchants include chlorine based etchants. In some embodiments, the gate dielectric region 20B remains on the channel layer 12A and the spacer dielectric region 22C and 22D remain on the channel layer 12A underlying the spacer element 71A and the spacer element 71B respectively.

Figure 7:
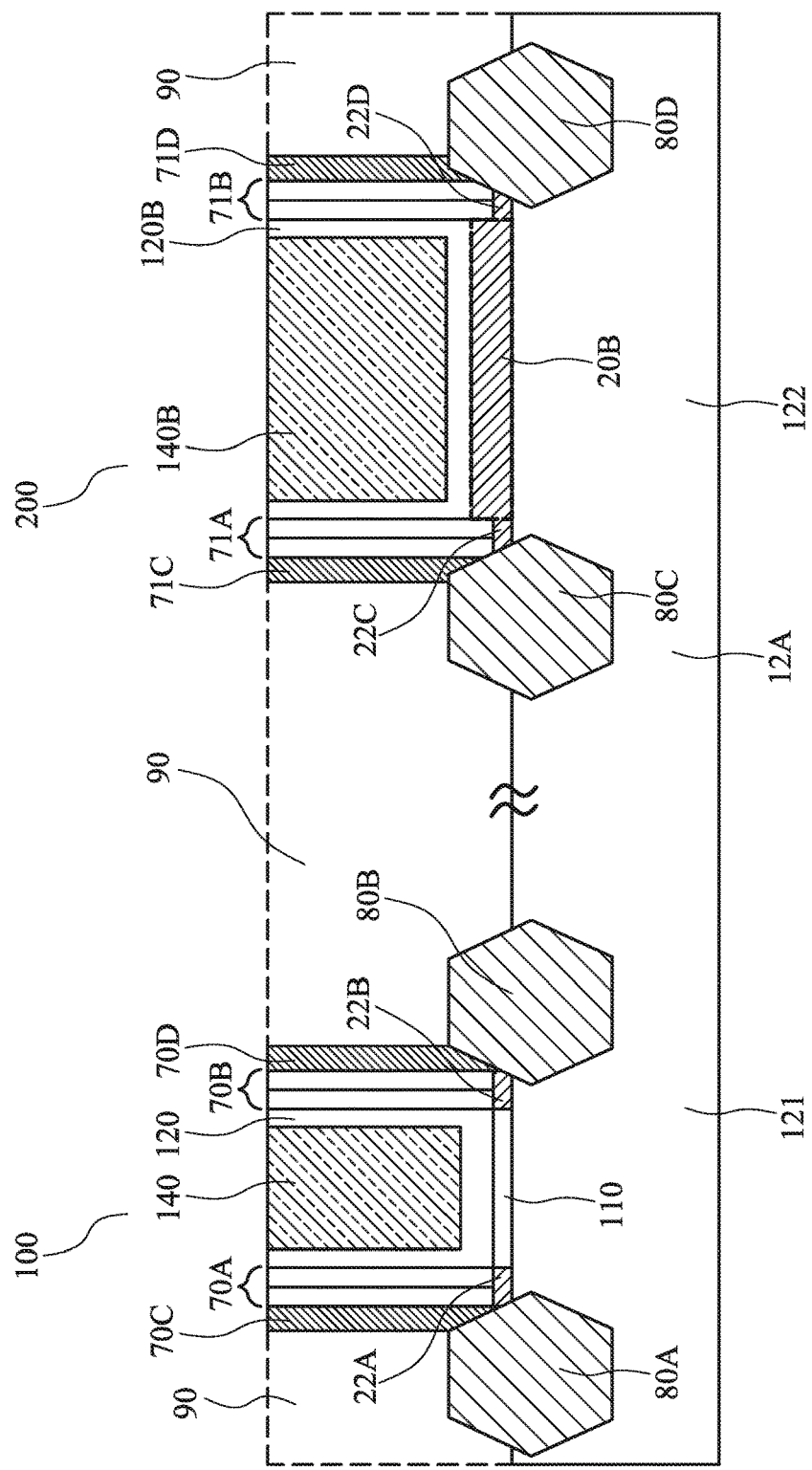

As shown in FIG. 7, gate structures are formed in the opening provided by the removal of the first dummy gate structure 60 and the part of the second dummy gate structure 60B to form Fin FET devices 100 and 200. FIG. 8A is an exemplary planar view of a Fin FET device 100 disposed in a core region as shown in FIG. 7. FIG. 8B is an exemplary planar view of a Fin FET device 200 disposed in a peripheral region as shown in FIG. 7. In one embodiment, the gate structure of the Fin FET device 100 includes an interfacial layer 110, a high-k dielectric layer 120, a metal layer 140 and/or other suitable materials for a gate structure. In one embodiment, the gate structure of the Fin FET device 200 includes the dielectric region 20B, a high-k dielectric layer 120B, a metal layer 140B and/or other suitable materials for a gate structure. In other embodiments, the gate structure of the Fin FET device 100 or 200 may further include capping layers, etch stop layers, and/or other suitable materials. The interfacial layer 110 may include a dielectric material such as silicon oxide layer ($SiO_2$). The interfacial layer 110 may be formed by chemical oxidation, thermal oxidation, atomic layer deposition (ALD), CVD, and/or other suitable processes.

In some embodiments, the high-k dielectric layers 120 and 120B may comprise one or more layers of metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In this embodiment, hafnium oxide ($HfO_2$) is used. The high-k dielectric layers 120 and 120B may be formed by atomic layer deposition (ALD), chemical vapor deposition (CVD), physical vapor deposition (PVD), and/or other suitable methods.

The metal layers 140 and 140B may include one or more layers of Al, Cu, W, Ti, Ta, TiN, TiAl, TiAlC, TiAlN, TaN, NiSi, CoSi, other conductive materials with a work function compatible with the substrate material, or combinations thereof. The metal layers 140 and 140B may be formed by CVD, PVD, plating, and/or other suitable processes. One or more CMP processes may be performed during the formation of the gate structure.

In some embodiments, the gate voltage of the Fin FET 200 may be higher than that of the Fin FET 100, which requires the gate dielectric layer 20B of the Fin FET 200 to be thicker than the interfacial layer 110 of the Fin FET 100.

It is understood that the structures shown in FIGS. 1A-8B may undergo further CMOS processes to form various features such as contacts/vias, interconnect metal layers, dielectric layers, passivation layers, etc.

FIGS. 9-15B show another embodiment of the present disclosure. In the previous embodiment, a portion of the dielectric layer 20 is etched using an etching process to form the dielectric etch back region 22 including spacer dielectric regions 22A, 22B, 22C and 22D as shown in FIGS. 2-3.

Figure 9:
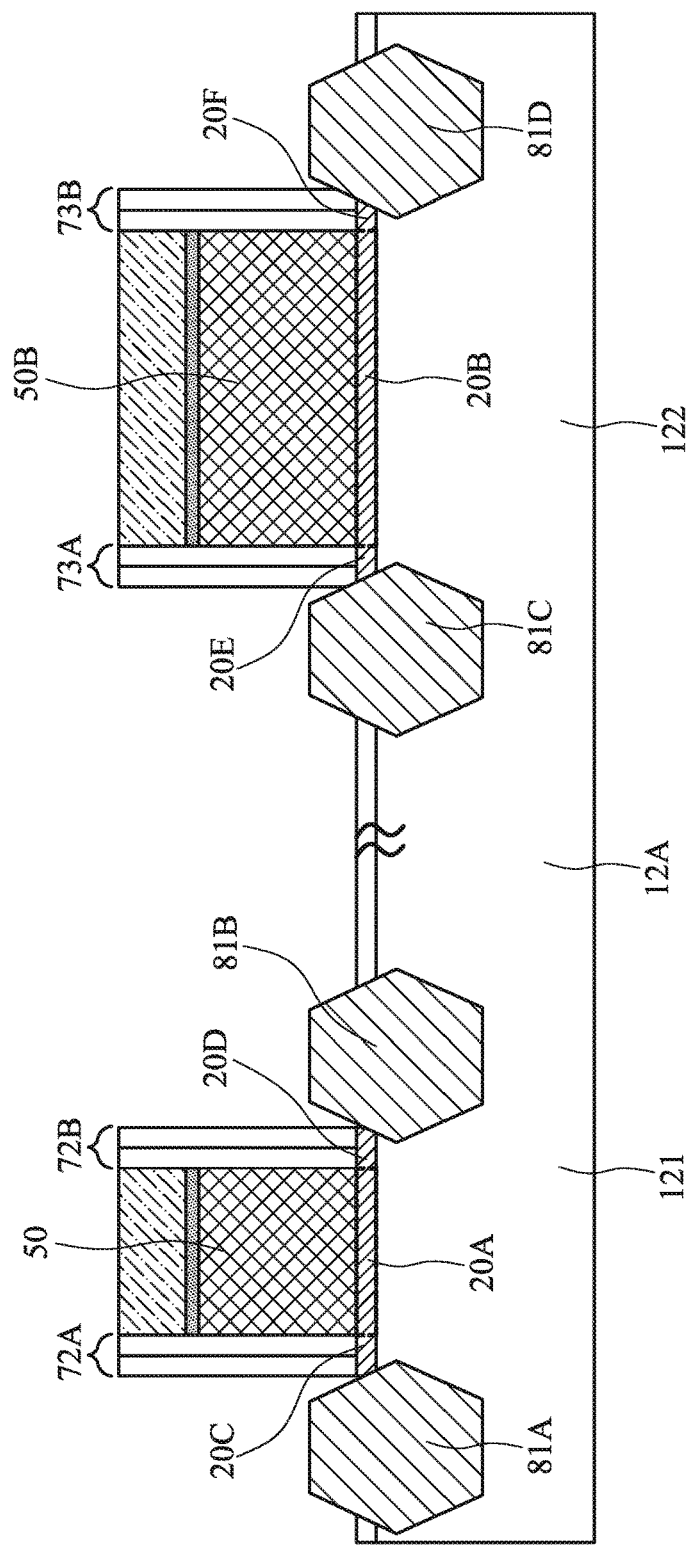
FIGS. 9-15B show exemplary sequential processes for manufacturing the Fin FET device according to another embodiment of the present disclosure.

Instead of etching a portion of the dielectric layer 20, no etching is performed on the dielectric layer 20 as shown in FIG. 9. That is, there is no difference between the height of the dummy gate dielectric region 20A and the height of the spacer dielectric region 20C or 20D. There is no difference between the height of the gate dielectric region 20B and the height of the spacer dielectric region 20E or 20F.

In one embodiment, the height (h) of the spacer dielectric regions 20C, 20D, 20E, 20F and the gate dielectric regions 20A, 20B is in a range of about 1 nm to 3 nm.

Figure 10:
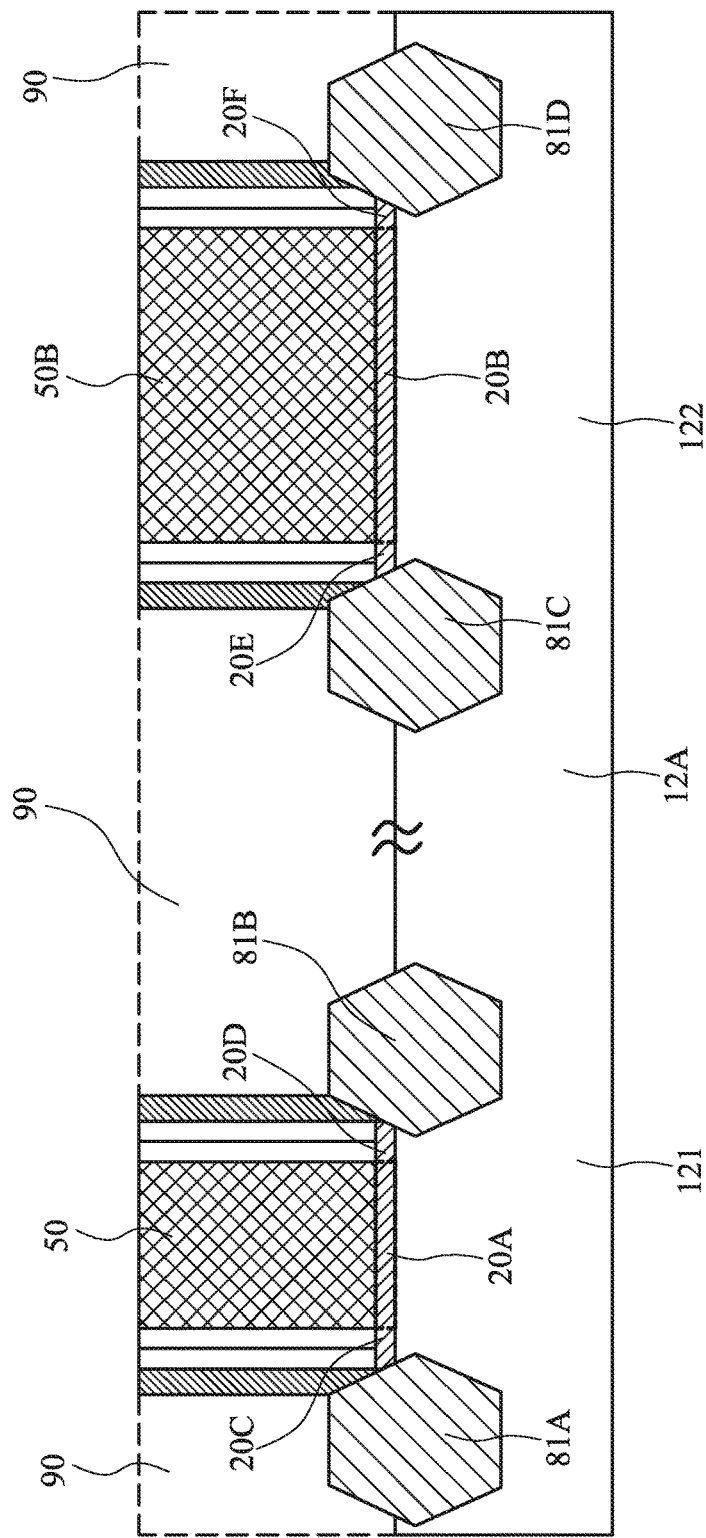
Figure 11:
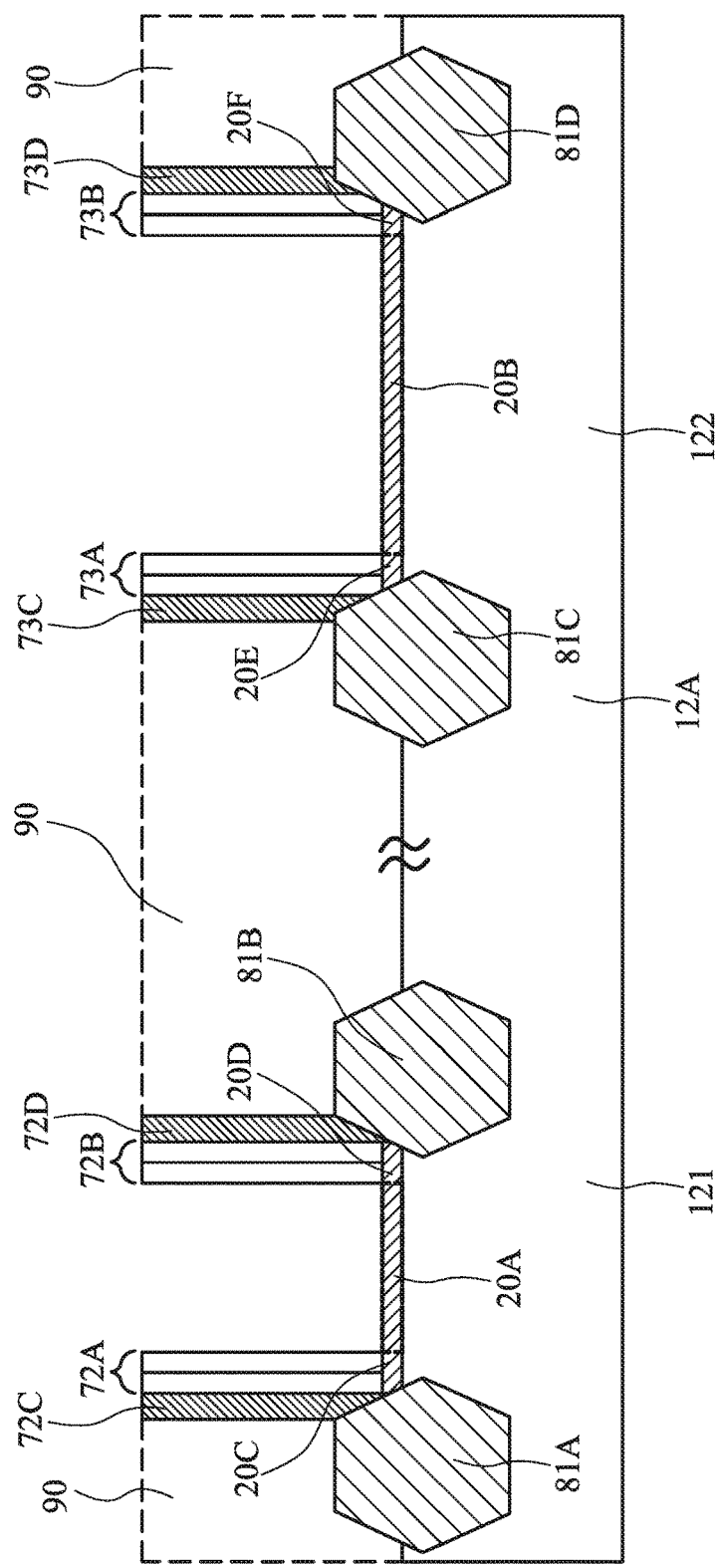
Figure 12:
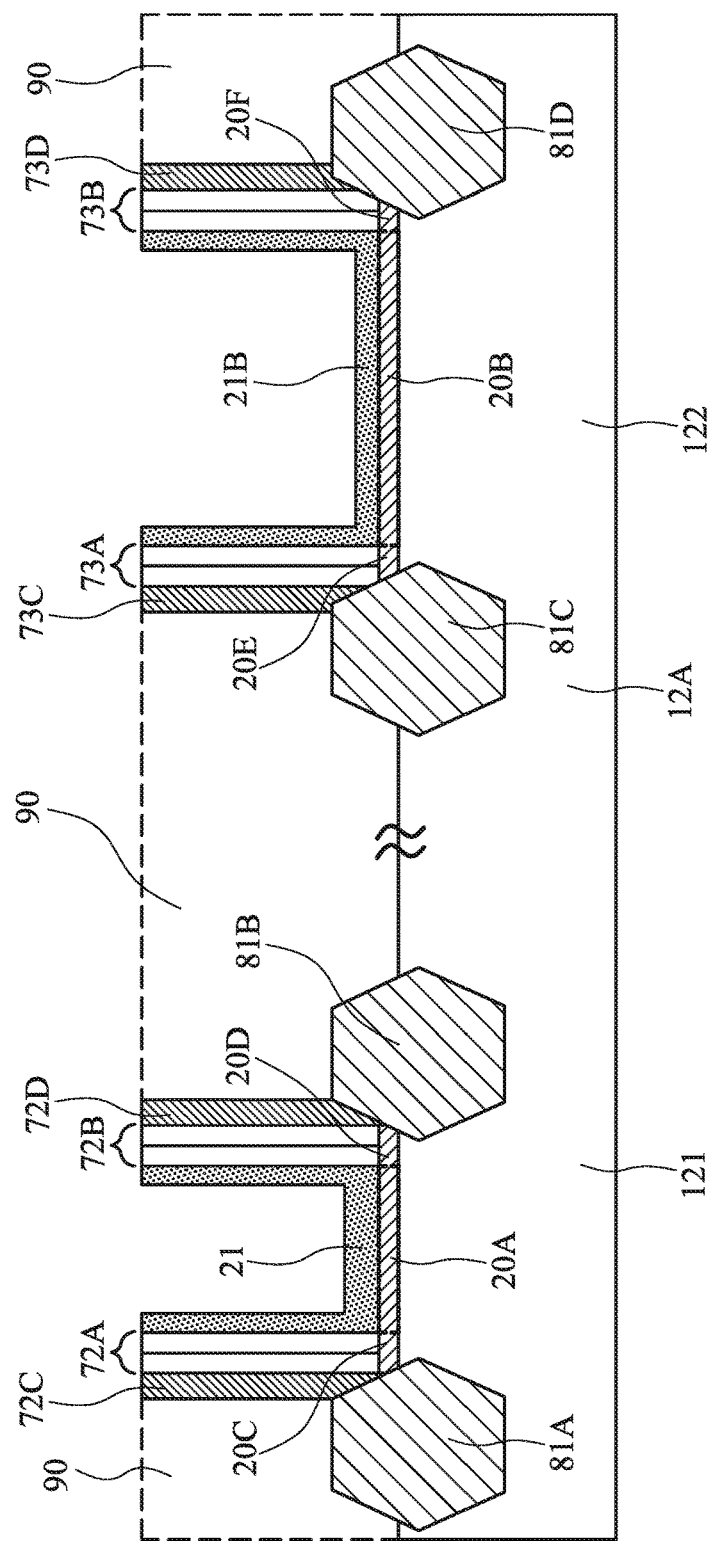

In some embodiments, source regions 81A, 81C, drain regions 81B, 81D, spacer elements 72A, 72B, and spacer elements 73A, 73B as shown in FIG. 9 may be formed in accordance with the details described with reference to FIG. 3. Subsequently, as shown in FIG. 10, the dummy gate electrode layer 50, 50B, ILD layer 90, and additional spacer element layers 72C, 72D, 73C and 73D may be formed and processed in accordance with the details described with reference to FIG. 4. As shown in FIG. 11, the dummy gate electrode layer 50 and 50B in FIG. 10 may be removed in accordance with the details described with reference to FIG. 5. As shown in FIG. 12, a multi-layer (e.g., bi-layer) structure of dielectric layers 21 is deposited on the dummy gate dielectric region 20A. A multi-layer (e.g., bi-layer) structure of dielectric layers 21B is deposited on the gate dielectric region 20B. Dielectric layers 21, 21B may include silicon oxide formed by thermal oxidation, CVD, PVD, ALD, e-beam evaporation, or other suitable process. In one embodiment, the thickness of the dielectric layers 21, 21B is in a range of about 1 nm to about 3 nm. In some embodiments, the dielectric layers 21, 21B may include a single dielectric layer. In some embodiments, a surface treatment process may be performed on a portion of the dielectric layer 20 not covered by the dummy gate electrode layer 50, 50B, such as including the spacer dielectric regions 20C, 20D, 20E, 20F, before forming the source regions 81A, 81C, drain regions 81B, 81D, spacer elements 72A, 72B, and spacer elements 73A, 73B.

Figure 13:
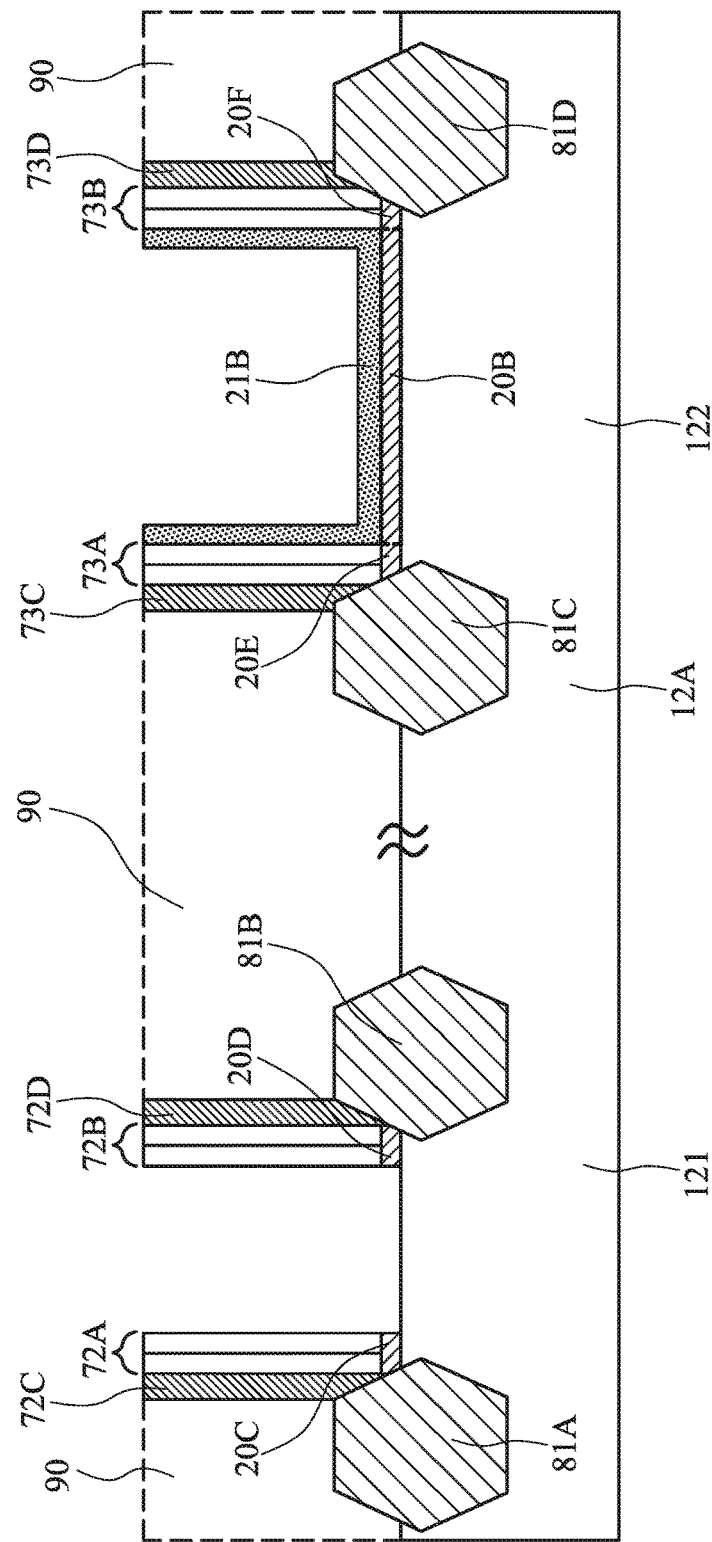
Figure 14:
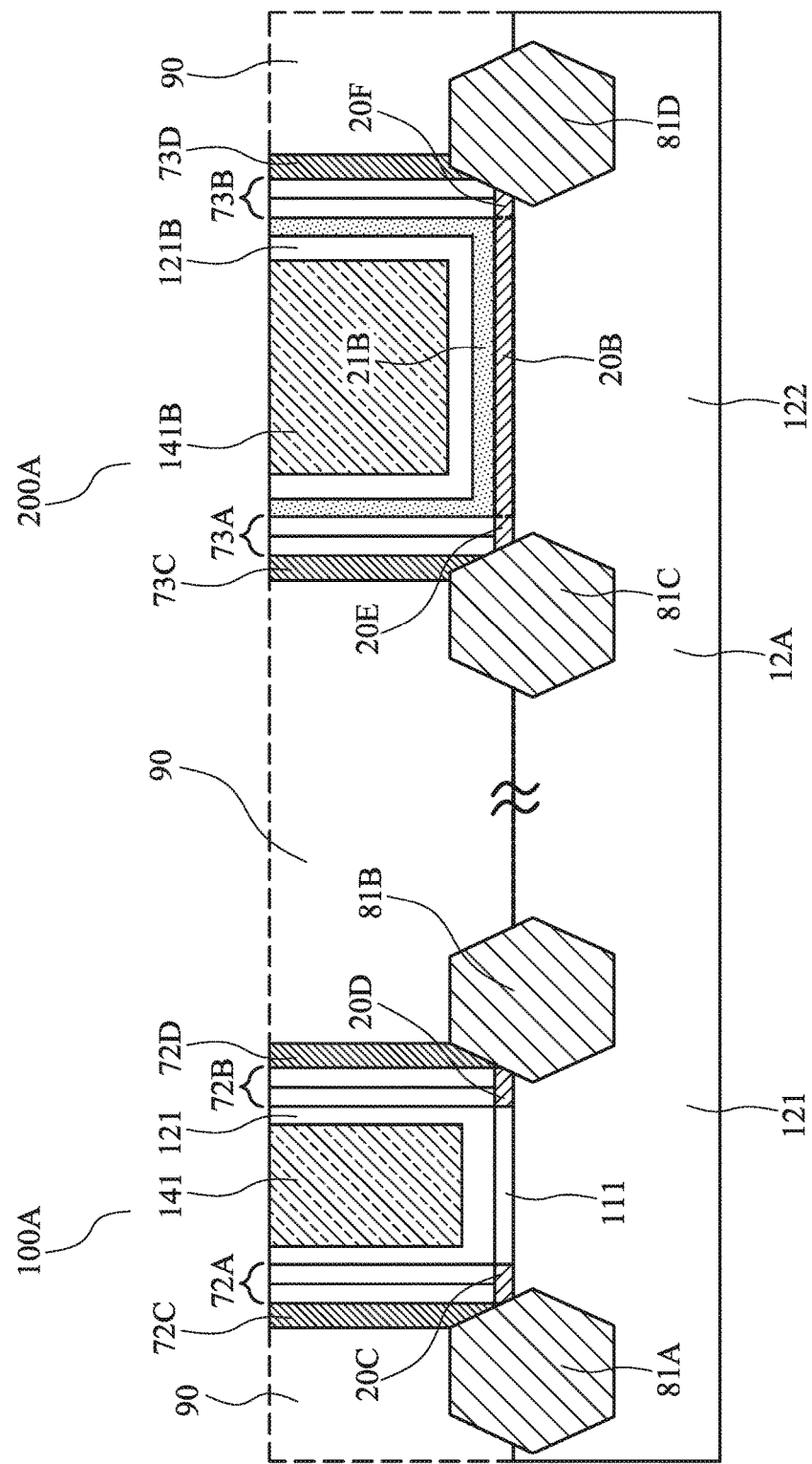

As shown in FIG. 13, the dummy gate dielectric region 20A and the dielectric layers 21 are removed using an etching process (wet etch, dry etch, plasma etch, etc.). The removal of the dummy gate dielectric region 20A may expose a top surface of the channel layer 12A. It is noted that the spacer dielectric region 20C and 20D remain on the channel layer 12A underlying the spacer element 72C and the spacer element 72D respectively. As shown in FIG. 13, the dielectric layer 21B remains on the dielectric region 20B. As shown in FIG. 14, a gate structure is formed in the opening provided by the removal of the first dummy gate structure 60 to form a Fin FET 100A in accordance with the details described with reference to FIG. 7. The gate structure may include an interfacial layer 111, a high-k dielectric layer 121, a metal layer 141 and/or other suitable materials for a gate structure. A gate structure including the metal layer 141B and the high-k dielectric layer 121B of a Fin FET 200A is formed in accordance with the details described with reference to FIG. 7.

It is understood that the device shown in FIGS. 9-14B may undergo further CMOS processes to form various features such as contacts/vias, interconnect metal layers, dielectric layers, passivation layers, etc.

Figure 15A:
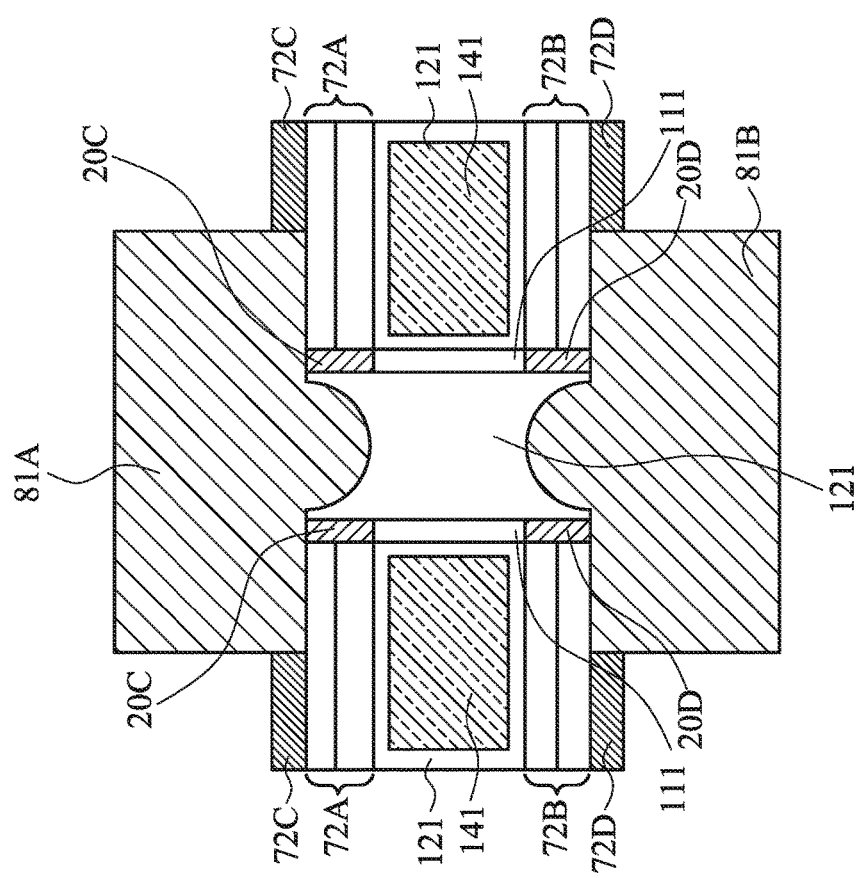
Figure 15B:
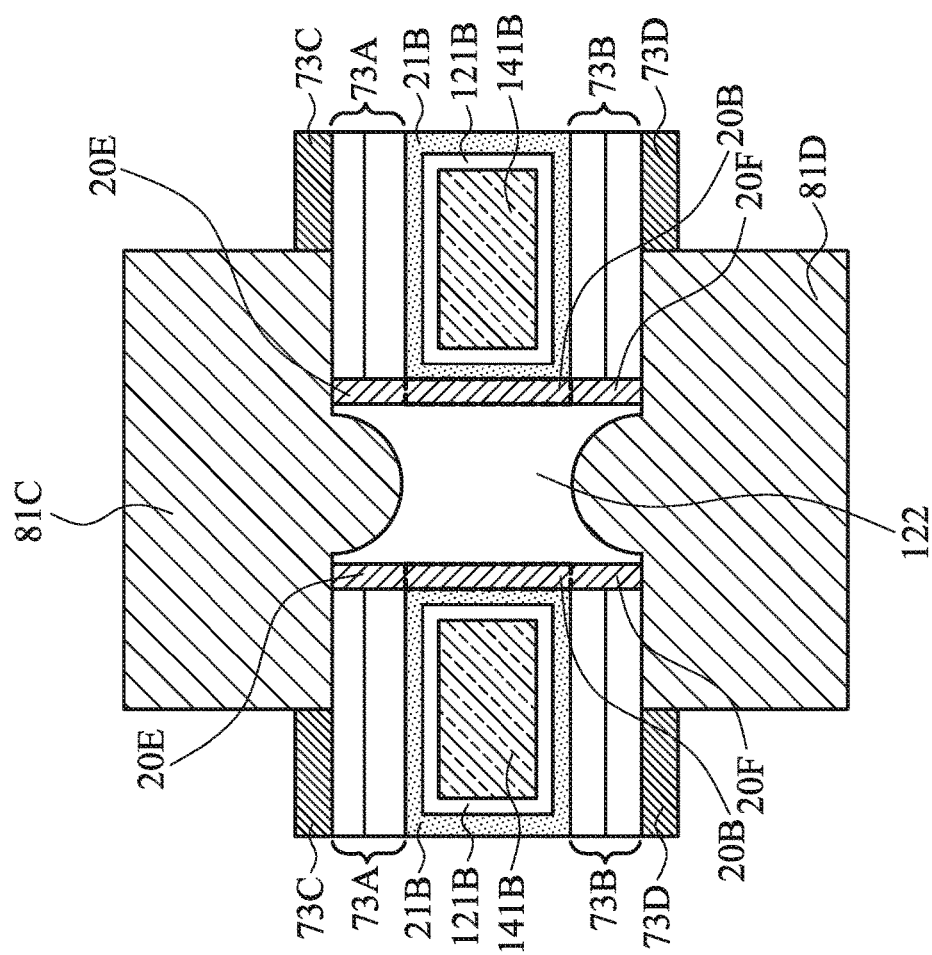

In some embodiments, the gate voltage of the Fin FET 200A may be higher than the Fin FET 100A, which requires the height of the gate dielectric layer 20B and the dielectric layer 21B of the Fin FET 200A to be thicker than interfacial layer 111 of the Fin FET 100A. FIG. 15A is an exemplary planar view of the Fin FET device 100A disposed in a core region as shown in FIG. 14. FIG. 15B is an exemplary planar view of the Fin FET device 200A disposed in a peripheral region as shown in FIG. 14.

The various embodiments or examples described herein offer several advantages over the existing art. For example, by optimizing the height of the spacer dielectric region and/or the difference between the height of the dummy gate dielectric region and height of the spacer dielectric region, it is possible to improve the immunity against the etching solution (e.g., dilute-HF and/or aqueous ammonia) for the spacer dielectric region, for example due to surface tension and capillary effects. It is also possible to improve gate-to-S/D isolation and device life time under hot carrier degradation. In another example, by using the surface treatment process to the spacer dielectric region, it is possible to improve the immunity against the etching solution (e.g., dilute-HF and/or aqueous ammonia) for the spacer dielectric region.

It will be understood that not all advantages have been necessarily discussed herein, no particular advantage is required for all embodiments or examples, and other embodiments or examples may offer different advantages. In one example, although the processes described with reference to FIGS. 1A-15B are associated with a semiconductor FET device having a fin structure (Fin FET), the processes described with reference to FIGS. 1A-15B may apply to a planar semiconductor device such as a planar MOSFET.

In accordance with one aspect of the present disclosure, a method of semiconductor fabrication includes forming a dielectric layer over a substrate. A first dummy gate structure is formed on the dielectric layer so that the dielectric layer includes a first gate dielectric region disposed below and defined by the first dummy gate structure. A portion of the dielectric layer not included in the first gate dielectric region is etched to form a dielectric etch back region adjacent the first gate dielectric region. A first spacer element is formed on a portion of the dielectric etch back region and on sidewalls of the first dummy gate structure, and the first spacer element abuts the dummy gate structure, the portion of the dielectric etch back region includes a first spacer dielectric region disposed below and defined by the first spacer element, and a height of the first gate dielectric region is greater than the height of the first spacer dielectric region. A first recessed portion is formed in the substrate. A strained material is selectively grown over the first recessed portion of the substrate to form a first strained recessed region, and the first strained recess region is adjacent the first spacer dielectric region. The first dummy gate structure and the first gate dielectric region are removed to form a first opening. A first gate structure including a gate electrode layer and a gate dielectric layer is formed in the first opening.

In accordance with another aspect of the present disclosure, a method of semiconductor fabrication includes forming a first dielectric layer over a substrate. A first dummy gate structure is formed on the first dielectric layer so that the first dielectric layer comprises a first gate dielectric region disposed below and defined by the first dummy gate structure. A first spacer element is formed on a portion of the first dielectric layer, and the first spacer element abuts the first dummy gate structure, and the portion of the first dielectric layer comprises a first spacer dielectric region disposed below and defined by the first spacer element. A first recessed portion is formed in the substrate. A strained material is selectively grown over the first recessed portion of the substrate to form a first strained recessed region, and the first strained recess region is adjacent the first spacer dielectric region. The first dummy gate structure is removed. A second dielectric layer is formed on the first gate dielectric region. The second dielectric layer and the first gate dielectric region are removed to form a first opening. A first gate structure including a gate electrode layer and a gate dielectric layer is formed in the first opening.

In accordance with another aspect of the present disclosure, a semiconductor device includes a first structure and a second structure. The first structure includes a first gate structure disposed over a substrate, a first spacer element abutting the first gate structure and a first strained recess region over a recessed portion in the substrate adjacent the first gate structure. The second structure includes a second gate structure disposed over the substrate, a second spacer element abutting the second gate structure and a second strained recess region over a recessed portion in the substrate adjacent the second gate structure. The first gate structure includes a first gate dielectric region disposed over the substrate and underlying a first gate electrode. The second gate structure includes a second gate dielectric region disposed over the substrate and underlying a second gate electrode. A first spacer dielectric region is disposed over the substrate and underlying the first spacer element and a second spacer dielectric region is disposed over the substrate and underlying the second spacer element. A height of the second gate dielectric region is greater than the height of the second spacer dielectric region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   forming a dielectric layer over a substrate;
   forming a first dummy gate structure on the dielectric layer so that the dielectric layer comprises a first gate dielectric region disposed below and defined by the first dummy gate structure;
   etching a portion of the dielectric layer not included in the first gate dielectric region to form a dielectric etch back region adjacent the first gate dielectric region;
   forming a first spacer element on a portion of the dielectric etch back region and on sidewalls of the first dummy gate structure, wherein the first spacer element abuts the first dummy gate structure, the portion of the dielectric etch back region comprises a first spacer dielectric region disposed below and defined by the first spacer element, and a height of the first gate dielectric region is greater than a height of the first spacer dielectric region;
   forming a first recessed portion in the substrate;
   selectively growing a strained material over the first recessed portion in the substrate to form a first strained recessed region, wherein the first strained recessed region is adjacent the first spacer dielectric region;
   removing the first dummy gate structure and the first gate dielectric region to form a first opening;
   forming a first gate structure by forming a gate electrode layer over a gate dielectric layer in the first opening;
   forming a second dummy gate structure on the dielectric layer so that the dielectric layer comprises a second gate dielectric region disposed below and defined by the second dummy gate structure;
   forming a second spacer element on a portion of the dielectric etch back region and on sidewalls of the second dummy gate structure, wherein the second spacer element abuts the second dummy gate structure, the portion of the dielectric etch back region comprises a second spacer dielectric region disposed below and defined by the second spacer element, and a height of the second gate dielectric region is greater than a height of the second spacer dielectric region;
   forming a second recessed portion in the substrate;
   selectively growing the strained material over the second recessed portion in the substrate to form a second strained recessed region, wherein the second strained recessed region is adjacent the second spacer dielectric region;
   removing the second dummy gate structure to form a second opening; and
   forming a second gate structure by forming the gate electrode layer over the second gate dielectric region of the dielectric layer in the second opening.

2. The method of claim 1, wherein:
   the first gate dielectric region is located between a first sidewall and a second sidewall of the first dummy gate structure.

3. The method of claim 1, wherein:
   the second gate dielectric region is located between a third sidewall and a fourth sidewall of the second dummy gate structure.

4. The method of claim 1, wherein a difference between the height of the first gate dielectric region and the height of the first spacer dielectric region is between 1 nm to 3 nm.

5. The method of claim 1, wherein the height of the first spacer dielectric region is between 0.5 nm and 3.5 nm.

6. The method of claim 1, further comprising a surface treatment of the dielectric etch back region including oxidation, nitridation or ion implantation.

7. A method of semiconductor device fabrication, comprising:
 forming a first dielectric layer over a substrate;
 forming a first dummy gate structure on the first dielectric layer so that the first dielectric layer comprises a first gate dielectric region disposed below and defined by the first dummy gate structure;
 forming a first spacer element on a portion of the first dielectric layer and on sidewalls of the first dummy gate structure, wherein the first spacer element abuts the first dummy gate structure, and the portion of the first dielectric layer comprises a first spacer dielectric region disposed below and defined by the first spacer element;
 forming a first recessed portion in the substrate;
 selectively growing a strained material over the first recessed portion in the substrate to form a first strained recessed region, wherein the first strained recessed region is adjacent the first spacer dielectric region;
 removing the first dummy gate structure to form a first opening;
 forming a second dielectric layer n the first opening after removing the first dummy gate structure;
 removing the second dielectric layer and the first gate dielectric region; and
 forming a first gate structure by forming a first gate electrode layer over a third dielectric layer in the first opening.

8. The method of claim 7, further comprising:
 forming a second dummy gate structure on the first dielectric layer so that the first dielectric layer comprises a second gate dielectric region disposed below and defined by the second dummy gate structure;
 forming a second spacer element on a portion of the first dielectric layer and on sidewalls of the second dummy gate structure, wherein the second spacer element abuts the second dummy gate structure, the portion of the first dielectric layer comprises a second spacer dielectric region disposed below and defined by the second spacer element;
 forming a second recessed portion in the substrate;
 selectively growing the strained material over the second recessed portion in the substrate to form a second strained recessed region, wherein the second strained recessed region is adjacent the second spacer dielectric region;
 removing the second dummy gate structure to form a second opening;
 after removing the second dummy gate structure, forming the second dielectric layer on the first dielectric layer in the second opening; and
 forming a second gate structure by forming a second gate electrode layer on the second dielectric layer in the second opening.

9. The method of claim 7, wherein:
 the first gate dielectric region is located between a first sidewall and a second sidewall of the first dummy gate structure.

10. The method of claim 8, wherein:
 the second gate dielectric region is located between a third sidewall and a fourth sidewall of the second dummy gate structure.

11. The method of claim 7, wherein the thickness of the second dielectric layer is between 1 nm to 3 nm.

12. The method of claim 7, wherein the height of the first spacer dielectric region is between 0.5 nm and 3.5 nm.

13. The method of claim 7, further comprising a surface treatment of the first dielectric layer not covered by the first dummy gate structure, the surface treatment including oxidation, nitridation or ion implantation.

14. The method of claim 7, wherein forming the second dielectric layer comprises forming multiple dielectric layers on the first gate dielectric region.

15. A method of semiconductor device fabrication, comprising:
 forming a fin structure on a substrate;
 forming a first dielectric layer over the fin structure;
 forming a first dummy gate on the first dielectric layer over a first region of the fin structure, the first dummy gate defining the first region of the fin structure;
 forming a second dummy gate on the first dielectric layer over a second region of the fin structure;
 forming a first spacer on a first portion of the first dielectric layer adjacent to the first dummy gate and on sidewalls of the first dummy gate, and on a second portion of the first dielectric layer adjacent to the second dummy gate and on sidewalls of the second dummy gate;
 forming source and drain regions on third regions and fourth regions of the fin structure, wherein the third regions of the fin structure are on opposing sides of the first dummy gate and the fourth regions of the fin structure are on opposing sides of the second dummy gate;
 removing the first dummy gate and the second dummy gate;
 removing the first dielectric layer over the first region of the fin structure;
 after removing the first dielectric layer over the first region of the fin structure, forming a second dielectric layer over the first region of the fin structure and over the first dielectric layer over the second region of the fin structure;
 removing the second dielectric layer over the first region of the fin structure;
 after removing the second dielectric layer over the first region of the fin structure, forming a high-k dielectric layer over the first region of the fin structure and over the second region of the fin structure;
 forming a first gate electrode over the high-k dielectric layer over the first region of the fin structure; and
 forming a second gate electrode over the high-k dielectric layer over the second region of the fin structure.

16. The method of claim 15, further comprising forming a second spacer adjacent to the first spacer on the sidewalls of the first dummy gate and second dummy gate and on the source and drain regions.

17. The method of claim 15, further comprising forming an interfacial layer over the first region of the fin structure after removing the first dielectric layer over the first region of the fin structure, and before forming the high-k dielectric layer over the first region of the fin structure.

18. The method according to claim 15, further comprising removing the first dielectric layer from a region between the first spacer on the sidewalls of the first dummy gate and the first spacer on the sidewalls of the second dummy gate.

* * * * *